United States Patent
Ma et al.

(10) Patent No.: US 11,347,042 B2
(45) Date of Patent: May 31, 2022

(54) LENS MODULE CAPABLE OF CHANGING FOCAL DISTANCE AND ELECTRONIC DEVICE USING THE SAME

(71) Applicant: TRIPLE WIN TECHNOLOGY(SHENZHEN) CO.LTD., Shenzhen (CN)

(72) Inventors: Xiao-Mei Ma, Guangdong (CN); Shin-Wen Chen, New Taipei (TW); Kun Li, Guangdong (CN); Long-Fei Zhang, Guangdong (CN)

(73) Assignee: TRIPLE WIN TECHNOLOGY(SHENZHEN) CO.LTD., Shenzhen (CN)

( * ) Notice: Subject to any disclaimer, the term of this patent is extended or adjusted under 35 U.S.C. 154(b) by 122 days.

(21) Appl. No.: 16/680,812

(22) Filed: Nov. 12, 2019

(65) Prior Publication Data
US 2021/0072528 A1   Mar. 11, 2021

(30) Foreign Application Priority Data

Sep. 9, 2019   (CN) .......................... 201910857655.3

(51) Int. Cl.
| | |
|---|---|
| *G02B 3/12* | (2006.01) |
| *H04N 5/225* | (2006.01) |
| *G02B 21/24* | (2006.01) |
| *G02B 15/22* | (2006.01) |
| *H05K 1/02* | (2006.01) |
| *G02B 21/26* | (2006.01) |

(52) U.S. Cl.
CPC ............. *G02B 21/241* (2013.01); *G02B 3/12* (2013.01); *G02B 15/22* (2013.01); *H05K 1/0296* (2013.01); *G02B 21/26* (2013.01)

(58) Field of Classification Search
CPC ... G02B 1/06; G02B 3/12; G02B 3/14; G02B 21/26; G02B 21/241; H05K 1/0296
USPC .................................................. 359/665–667
See application file for complete search history.

(56) References Cited

U.S. PATENT DOCUMENTS

| | | | |
|---|---|---|---|
| 8,411,193 B2* | 4/2013 | Chiu | .......................... G02F 1/29 348/335 |
| 2005/0035421 A1* | 2/2005 | Kayanuma | ........... H04N 5/2253 257/432 |
| 2008/0013187 A1* | 1/2008 | Craen | .................... G02B 7/021 359/665 |

(Continued)

FOREIGN PATENT DOCUMENTS

TW          M481426          7/2014

*Primary Examiner* — Thong Q Nguyen
(74) *Attorney, Agent, or Firm* — ScienBiziP, P.C.

(57) ABSTRACT

A lens module includes a printed circuit board, a lens component, and at least two electric conductors. The lens component includes a first lens and a microscope base, the first lens is formed on the microscope base, the microscope base is formed on the printed circuit board, and the first lens is electrically conductive and deforms under voltage. The first lens is electrically connected to the printed circuit board by the electric conductors. The printed circuit board outputs a voltage to the first lens through the electric conductors; the first lens deforms according to the voltage thereby changing a focal distance of light passing through the first lens. The disclosure also relates to an electronic device using the lens module. The lens module can has a zoom function and has a litter volume.

2 Claims, 4 Drawing Sheets

(56) References Cited

U.S. PATENT DOCUMENTS

2011/0134303 A1\* 6/2011 Jung .................... H04N 5/2251
348/340

\* cited by examiner

LENS MODULE CAPABLE OF CHANGING FOCAL DISTANCE AND ELECTRONIC DEVICE USING THE SAME

FIELD

The subject matter of the application generally relates to a lens module.

BACKGROUND

Electronic devices, such as mobile phones, tablet computers or cameras, may have lens modules. A voice coil motor of the electronic device is necessary. The voice coil motor pushes the lens to move to achieve different focal distance. As the pixels of the lens module get higher, the volume of the voice coil motor becomes larger.

Therefore, there is room for improvement in the art.

BRIEF DESCRIPTION OF THE DRAWINGS

Implementations of the present disclosure will now be described, by way of embodiments, with reference to the attached figures.

DETAILED DESCRIPTION

Figure 1:
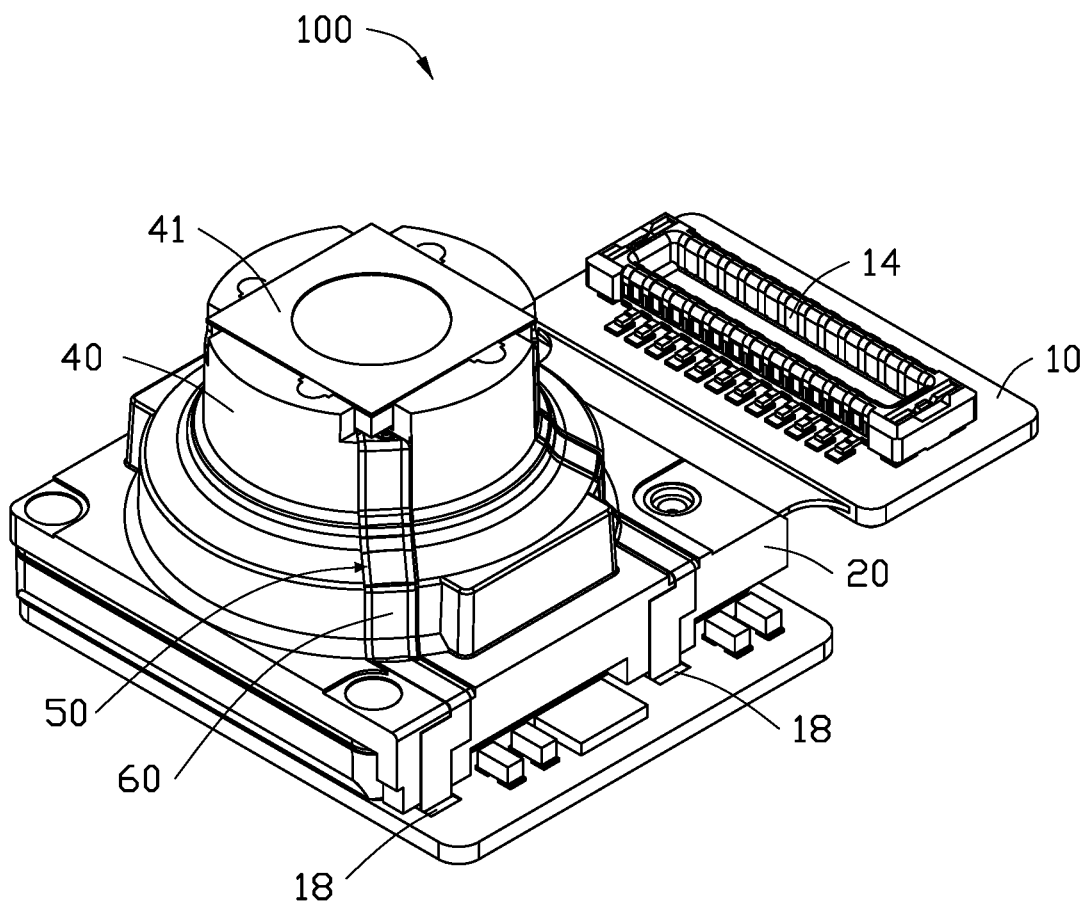
FIG. 1 is a perspective view of a first embodiment of a lens module according to the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain portions may be exaggerated to better illustrate details and features of the present disclosure.

The disclosure is illustrated by way of example and not by way of limitation in the figures of the accompanying drawings, in which like references indicate similar elements. It should be noted that references to "an" or "one" embodiment in this disclosure are not necessarily to the same embodiment, and such references mean "at least one."

The term "comprising," when utilized, means "including, but not necessarily limited to"; it specifically indicates open-ended inclusion or membership in the so-described combination, group, series, and the like.

Figure 2:
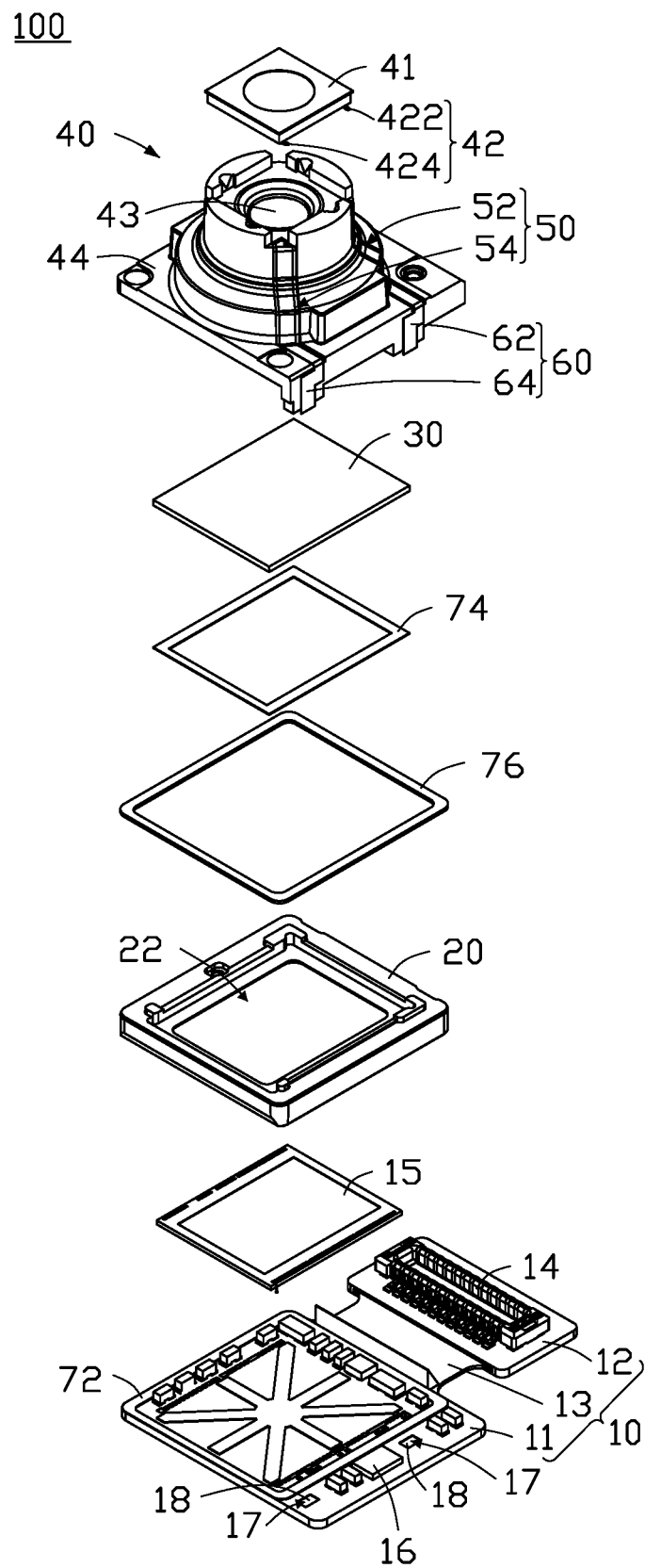
FIG. 2 is an exploded view of the lens module of FIG. 1.
Figure 3:
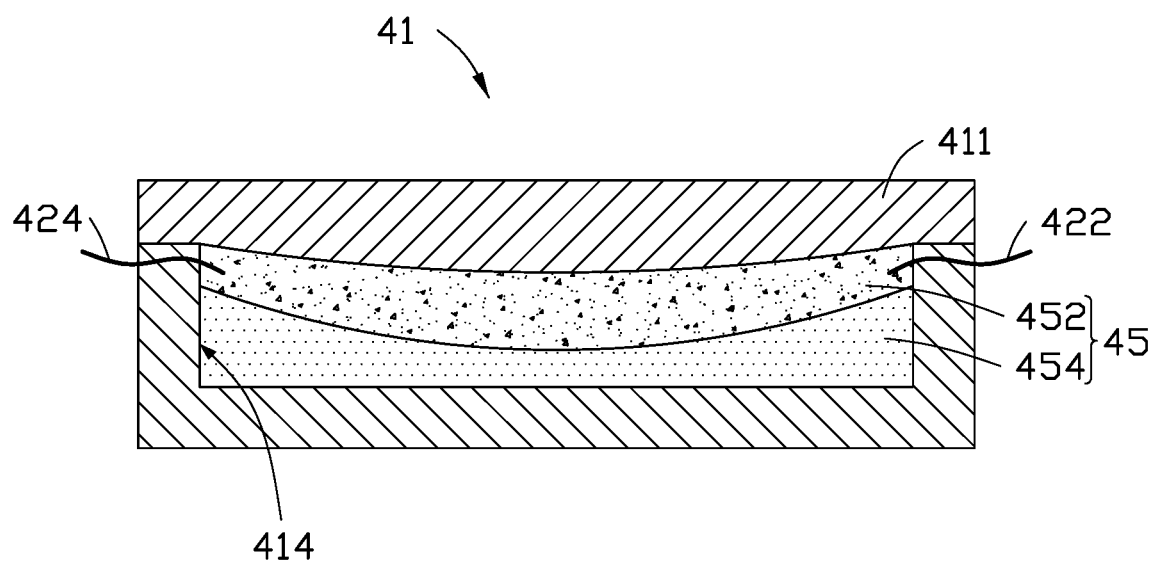
FIG. 3 is a cross-section view of a first lens of the lens module of FIG. 1.

FIGS. 1-3 show an embodiment of a lens module 100. The lens module 100 includes a printed circuit board 10, a lens component 40, and at least two electric conductors 60. The lens component 20 includes a first lens 41. The first lens 41 electrically conductive and deforms under voltage to change the focal distance of lights passing through the first lens 41. The printed circuit board 10 is electrically connected to the first lens 41 by the electric conductors 60. The printed circuit board 10 outputs a voltage to the first lens 41 through the electric conductors 60. The first lens 41 deforms according to the voltage thereby changing a focal distance of light passing through the first lens 41.

The electric conductors 60 are made from a material which is electrically conductive, such as a metal, a metal alloy, a polymer material, and the likes. In at least one embodiment, the electric conductors 60 are made from a metal. The electric conductors 60 are formed on the printed circuit board 10 and the lens component 40 by a laser direct structuring (LDS) technology.

The printed circuit board 10 may be a flexible printed circuit board, a rigid printed circuit board, a rigid-flex printed circuit board, or the like. In at least one embodiment, the printed circuit board 10 is a rigid-flex printed circuit board.

In FIG. 2, the printed circuit board 10 includes a first rigid portion 11, a second rigid portion 12, and a flexible portion 13. The flexible portion 13 is located between the first rigid portion 11 and the second rigid portion 12. An electrical connection portion 14 is mounted on the second rigid portion 12. The electrical connection portion 14 may be a connector or an edge connector (gold fingers). The electrical connection portion 14 is used to implement signal transmission between the lens module 100 and an external electronic components.

A sensor 15 and a plurality of electronic components 16 are mounted on the first rigid portion 11. The sensor 15 is electrically connected to the printed circuit board 10 and is used to receive a light passing through the lens component 40 and convert the light into image data. The electronic components 16 can be components such as a resistor, a capacitor, a diode, a transistor, a relay, or an electrically erasable programmable read only memory (EEPROM). In at least one embodiment, the electrical connection portion 14, the sensor 15, and the plurality of electronic components 16 are formed on a same surface of the printed circuit board 10. In other embodiment, the electrical connection portion 14, the sensor 15, and the plurality of electronic components 16 are formed on a different surface of the printed circuit board 10.

At least two second receiving grooves 17 are defined in the first rigid portion 11. The second receiving grooves 17 and the sensor 15 are formed on a same surface of the printed circuit board 10. At least two conductive terminals 18 are received in the second receiving grooves 17. The conductive terminals 18 have opposite polarity. The conductive terminals 18 are used to electrically connect to the electric conductors 60 or to make the lens module has an optical image stabilization (OIS) function. In at least one embodiment, the number of the second receiving grooves 17 is two. In other embodiment, the number of the second receiving grooves 17 is not be limit to 2.

In other embodiment, the second receiving groove 17 also can be omitted.

In FIG. 2, the lens module 100 further includes a bearing seat 20. The bearing seat 20 is mounted on the first rigid portion 11. In at least one embodiment, the bearing seat 20 is mounted on the first rigid portion 11 by a first adhesive 72. In at least one embodiment, the bearing seat 20, the sensor 15, and the plurality of electronic components 16 are formed on a same surface of the printed circuit board 10. The bearing seat 20 is roughly rectangular. A through hole 22 is defined in the bearing seat 20. The through hole 22 penetrates through the bearing seat 20 and faces the sensor 15.

An optical filter 30 is formed on the bearing seat 20. The optical filter 30 faces the through hole 22. The optical filter 30 and the sensor 15 are formed on two opposite sides of the bearing seat 20. In at least one embodiment, the optical filter 30 is mounted on the bearing seat 20 by a second adhesive 74. In at least one embodiment, the optical filter 30 is rectangular.

In FIG. 2, the lens component 40 further includes a microscope base 44. The microscope base 44 is used to fix the first lens 41. The first lens 41 is formed on the microscope base 44. The microscope base 44 is mounted on the bearing seat 20 by a third adhesive 76.

At least two first receiving grooves 50 are defined in an outer wall of the microscope base 44 and an outer wall of the bearing seat 20. The first receiving grooves 50 are used to receive the electric conductors 60. One end of each of the first receiving grooves 50 abuts the first lens 41, the other ends of each of the first receiving grooves 50 abuts the printed circuit board 10. That is, each of the first receiving grooves 50 are defined from the first lens 41 to the outer wall of the microscope base 44 and from the outer wall of the bearing seat 20 to the printed circuit board 10.

In at least one embodiment, a number of the first receiving grooves 50 are two, which are named a first receiving groove portion 52 and a second receiving groove portion 54. The first receiving groove portion 52 and the second receiving groove portion 54 are spaced from each other.

In at least one embodiment, a number of the electric conductors 60 are two, which are named a first electric conductor 62 and a second electric conductor 64. The first electric conductor 62 is received in the first receiving groove portion 52 and the second electric conductor 64 is received in the second receiving groove portion 54.

The lens component 40 further includes a second lens 43. The second lens 43 is received in the microscope base 44 and formed between the first lens 41 and the microscope base 44.

The first lens 41 can adjust the focal distance by changing the voltage of the first lens 41. The focal distance of the lights passing through the first lens 41 will change. The lights passing through the first lens 41 pass through the second lens 43 and are converged on the sensor 15 to form a desired image. The first lens 41 cooperates with the second lens 43 to form the desired image.

In FIGS. 2-3, the first lens 41 includes at least two electrodes 42, a filler 45 which is electrically conductive and deforms under voltage, and a sealing body 411 with a cavity 414. The sealing body 411 is made from a euphotic material. One end of each of the electrodes 42 is electrically connected to the electric conductor 60, the other end of each of the electrodes 42 extends to the cavity 414 and is electrically connected to the filler 45. The filler 45 is sealed in the cavity 414.

In at least one embodiment, a number of the electrodes 42 are two, which are named a first electrode 422 and a second electrode 424. The first electrode 422 and the second electrode 424 have opposite polarity. The first electrode 422 is electrically connected to the first electric conductor 62 and the second electrode 424 is electrically connected to the second electric conductor 64. The first electrode 422 and the second electrode 424 are electrically connected to the conductive terminals 18 formed on the printed circuit board 10 to electrically connect to a positive pole and a negative pole of the printed circuit board 10.

The filler 45 is at least one of a liquid filler and a solid filler. In at least one embodiment, the filler 45 is a liquid filler. The filler 45 includes a first liquid 452 and a second liquid 454. The first liquid 452 and the second liquid 454 cannot dissolve with each other. At least one of the first liquid 452 and the second liquid 454 is electrically conductive and deforms under voltage to change a shape and a curvature of a contacting surface between the first liquid 452 and the second liquid 454 thereby changing the focal distance of light passing through the first lens 41, and to make the lens module 100 has a zoom function.

Figure 4:
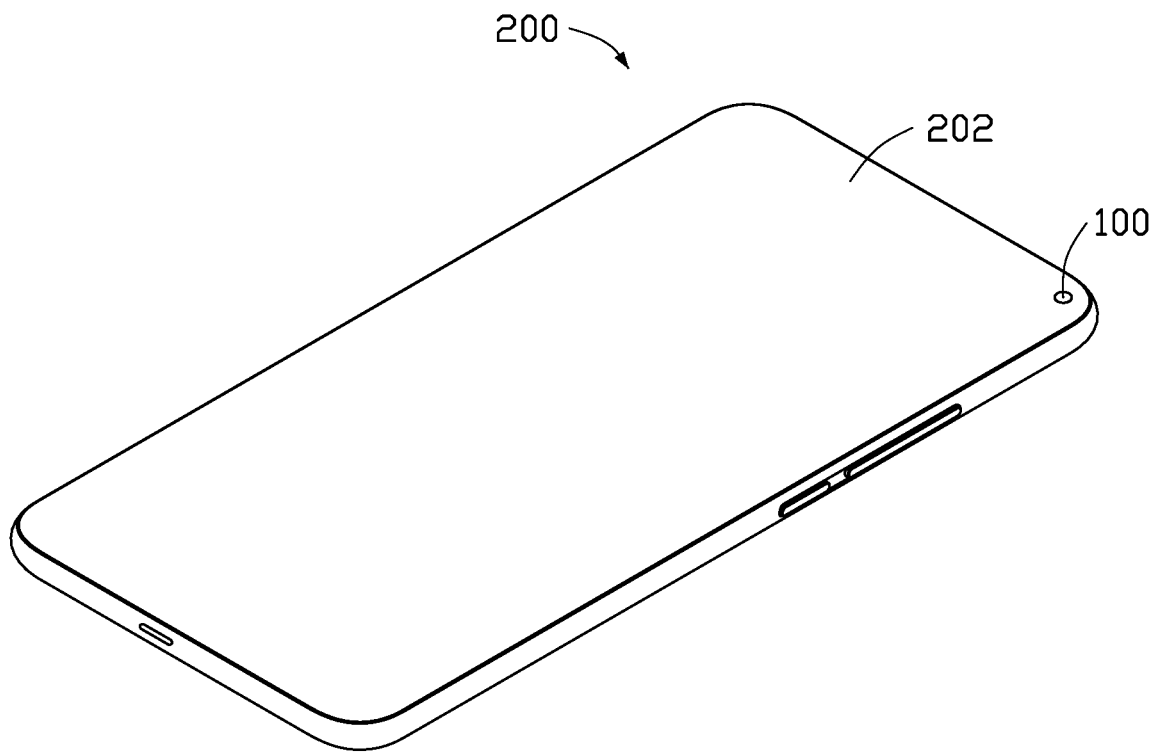
FIG. 4 is a perspective view of an electronic device.

FIG. 4 shows an embodiment of an electronic device 200. The electronic device 200 includes a body 202 and the lens module 100 mounted in the body 202. The electronic device 200 may be a smart phone, a tablet computer, or the like. In at least one embodiment, the electronic device 200 is a smart phone.

With the embodiments described above, the lens module 100 includes a first lens 41 capable of conducting electricity and producing deformation under voltage to change the focal distance of lights passing through the first lens 41, and is electrically connected to printed circuit board 10 by at least two electric conductors 60, so the lens module 100 can change the focal distance by the first lens 41, not by a voice coil motor. Furthermore, defining at least two first receiving grooves 50 in the outer wall of the microscope base 44 and the outer wall of the bearing seat 20 which are used to receive the electric conductors 60 can avoid increasing extra volume of the lens module 100, and can protect the electric conductors 60 from damaging.

The embodiments shown and described above are only examples. Many details are often found in the art such as the other features of a lens module and an electronic device using the lens module. Therefore, many such details are neither shown nor described. Even though numerous characteristics and advantages of the present disclosure have been positioned forth in the foregoing description, together with details of the structure and function of the present disclosure, the disclosure is illustrative only, and changes can be made in the detail, including in matters of shape, size, and arrangement of the parts within the principles of the present disclosure, up to and including the full extent established by the broad general meaning of the terms used in the claims. It will therefore be appreciated that the embodiments described above can be modified within the scope of the claims.

What is claimed is:

1. A lens module comprising:
a printed circuit board;
a bearing seat mounted on the printed circuit board;
a lens component, wherein the lens component comprises a first lens and a microscope base, the first lens is formed on the microscope base, the microscope base is formed on the bearing seat, and the first lens is electrically conductive and configured to deform under a change of a voltage applied to the first lens, thereby changing a focal distance of the first lens; at least two first receiving grooves are defined in an outer wall of the microscope base and an outer wall of the bearing seat, wherein the lens component further comprises a second lens received in the microscope base, the second lens is formed between the first lens and the microscope base; and
at least two electric conductors received in the at least two first receiving grooves, one end of each of the at least two first receiving grooves abutting the first lens, the other end of each of the at least two first receiving grooves abutting the printed circuit board, to cause two ends of each of the at least two electric conductors to electrically connect to the first lens and the printed circuit board; the printed circuit board outputs the voltage to the first lens through the at least two electric conductors.

2. An electronic device, comprising:
a body;
a lens module mounted in the body comprising:
   a printed circuit board;
   a bearing seat mounted on the printed circuit board;
   a lens component, wherein the lens component comprises a first lens and a microscope base, the first lens is formed on the microscope base, the microscope base is formed on the bearing seat, and the first lens is electrically conductive and configured to deform under a change of a voltage applied to the first lens, thereby changing a focal distance of the first lens; at least two first receiving grooves are defined in an outer wall of the microscope base and an outer wall of the bearing seat, wherein the lens component further comprises a second lens received in the microscope base, the second lens is formed between the first lens and the microscope base; and
   at least two electric conductors received in the at least two first receiving grooves, one end of each of the at least two first receiving grooves abutting the first lens, the other end of each of the at least two first receiving grooves abutting the printed circuit board, to cause two ends of each of the at least two electric conductors to electrically connect to the first lens and the printed circuit board; the printed circuit board outputs the voltage to the first lens through the at least two electric conductors.

* * * * *